United States Patent [19]

Shiraishi et al.

[11] Patent Number: 4,766,335

[45] Date of Patent: Aug. 23, 1988

[54] ANALOG-DIGITAL HYBRID INTEGRATED CIRCUIT

[75] Inventors: Osamu Shiraishi; Hiroshi Hashimoto, both of Tokyo, Japan

[73] Assignee: Oki Electric Industry Co., Ltd., Tokyo, Japan

[21] Appl. No.: 17,684

[22] Filed: Feb. 24, 1987

[30] Foreign Application Priority Data

Feb. 27, 1986 [JP] Japan .................................. 61-42150

[51] Int. Cl.[4] ...................... H03K 17/22; H03K 17/30
[52] U.S. Cl. ................................. 307/592; 307/350; 307/597; 307/297
[58] Field of Search ........... 307/350, 359, 290, 296 R, 307/597, 593, 592, 296.4, 64

[56] References Cited

U.S. PATENT DOCUMENTS

| | | | |
|---|---|---|---|
| 4,473,759 | 9/1984 | Mahabadi | 307/350 |
| 4,572,966 | 2/1986 | Hepworth | 307/593 |
| 4,611,126 | 9/1986 | Miller | 307/597 |

OTHER PUBLICATIONS

"Linear Databook" published by National Semiconductor Corporation, 1982, pp. 3-350.
"A Monolithic PB (Push Button) Type Receiver", in Oki Electric Co., Ltd. Research and Development, No. 113, vol. 48, No. 1, May 1981.

Primary Examiner—John Zazworsky
Attorney, Agent, or Firm—Wenderoth, Lind & Ponack

[57] ABSTRACT

An analog-digital hybrid integrated circuit includes: an analog ground terminal set to provide an intermediate potential between a power source potential and a ground potential, a by-pass capacitor provided between the analog ground terminal and a ground terminal (or a power source terminal); and level comparator for comparing the potential on the analog ground terminal with prescribed threshold voltage and for providing high (or low) level voltage provided that the potential on the analog ground terminal is lower (or higher) than the prescribed threshold voltage whereby, the output voltage from the level comparator is supplied to an internal logical circuit as a reset signal.

13 Claims, 3 Drawing Sheets

ANALOG-DIGITAL HYBRID INTEGRATED CIRCUIT

BACKGROUND OF THE INVENTION

1. Field of the Invention

The present invention relates to an analog-digital hybrid integrated circuit provided with an initial set-up circuit.

2. Description of the Prior Art

An integrated circuit is provided with an initial set-up circuit for internal logical circuits.

For example, such an initial set-up circuit for use in a integrated circuit is as illustrated in FIG. 1. In FIG. 1, an integrated circuit LSI1 is reset when the voltage on its reset terminal RST becomes less than a prescribed threshold level due to a reset terminal RESET of an internal logical circuit LGC1 changing to a high (H) level via a Schmitt trigger inverter circuit IN. A capacitor C1 receives power source voltage E via a resistor R1 and provides a potential to the reset terminal RST.

A potential V1 on the reset terminal RST changes as follows when the power source E is turned on:

$$V1 = E(1 - \epsilon^{-t/C1R1}) \tag{1}$$

Hereupon, the inverter IN keeps the H level and hence the internal logical circuit LGC1 stays reset until the potential V1 reaches the threshold of the inverter IN. Thereafter, provided the potential exceeds the threshold value after the passage of a prescribed period of time, the inverter IN changes to a low level L to release the reset to permit ordinary operation to be started thereafter.

However, the integrated circuit, when fabricated as an analog-digital hybrid LSI circuit, must have many input and output terminals and hence is limited in its package size so as to often result in insufficient space for providing a terminal for use as the reset terminal.

SUMMARY OF THE INVENTION

It is an object of the present invention to provide an analog-digital hybrid integrated circuit capable of operating without the use of a terminal used exclusively for resetting the integrated circuit.

To achieve the above object, an analog-digital hybrid integrated circuit according to the present invention includes: an analog ground terminal set to provide an intermediate potential between power source potential and a ground potential; a by-pass capacitor provided between the analog ground terminal and a ground terminal (or a power source terminal); and level comparing means for comparing the potential on the analog ground terminal with a prescribed threshold voltage and for providing high (or low) level voltage provided that the potential on the analog ground terminal is lower than (or higher) than the presecribed threshold voltage, the output voltage from the level comparing means being delivered to an internal logical circuit as a reset signal.

According to an analog-digital hybrid integrated circuit of the present invention arranged as described above, the by-pass capacitor raises its potential based upon a time constant of charging thereof during the initial period of the power source being turned on, and then the level comparing means delivers a reset signal to the internal logical circuit until the above potential across the by-pass capacitor reaches the threshold voltage during the above process and it releases the reset signal provided the above potential exceeds the above threshold value.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
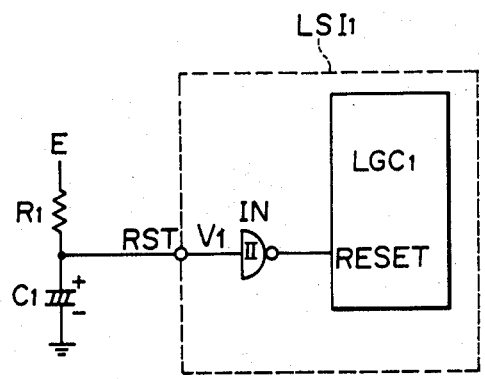
FIG. 1 is a schematical circuit block diagram exemplarily illustrating a prior hybrid integrated circuit.
Figure 2:
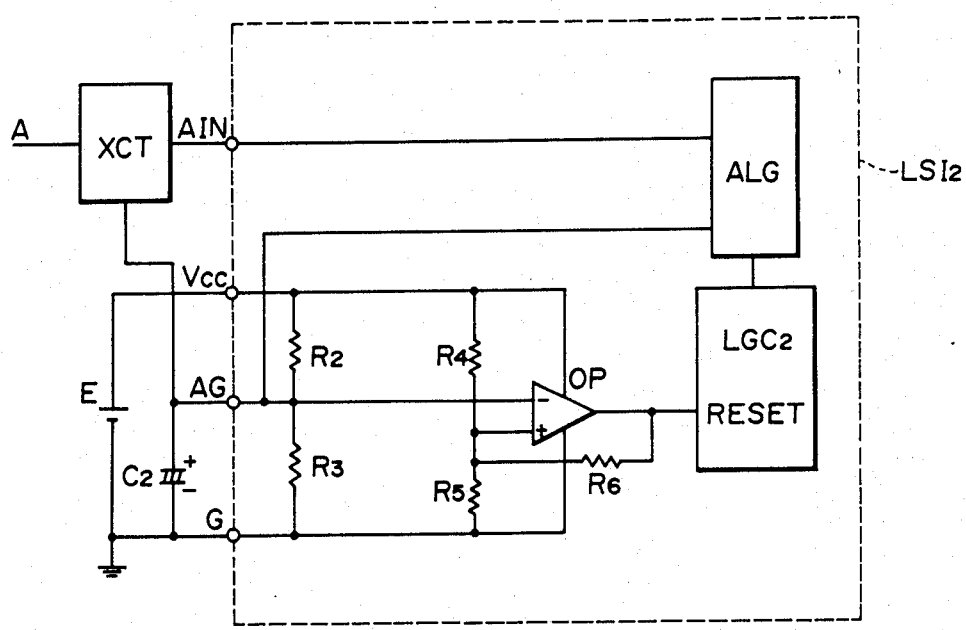
FIG. 2 is a circuit block diagram of an embodiment of an analog-digital hybrid integrated circuit according to the present invention.

Referring to FIG. 2, illustrating a circuit block diagram of an embodiment of an analog-digital hybrid integrated circuit according to the present invention, an analog-digital hybrid large scale integrated circuit (hereinafter referred to as an LSI) LSI2 has an analog signal input terminal AIN, a power source terminal VCC, an analog ground terminal AG, and a power source ground terminal G. An internal analog circuit ALG is connected to the analog signal input terminal AIN and the analog ground terminal AG, and further to an internal logical circuit LGC2. A power source E is applied connected to the power source terminal VCC, and halved by resistors R2 and R3. The analog ground terminal AG is supplied with half of the potential VCC E/2 for maximizing the dynamic range of an analog signal. In addition, a by-pass capacitor C2 for the analog grounding is connected between the analog ground terminal AG and the power source ground terminal G.

An external analog circuit XCT has an output line thereof connected to the analog signal input terminal AIN and receives an analog signal from input line A.

The external analog circuit XCT is furthermore connected to the analog ground terminal AG. An operational amplifier OP has a minus (−) terminal thereof for receiving the potential on the analog ground terminal AG and a plus (+) terminal thereof for receiving a synthesized potential of divided voltage of the power source terminal VCC by resistors R4 and R5 and a feedback potential from an output of the operational amplifier OP via a resistor R6. These elements form a Schmitt trigger circuit. Vth+ and Vth− of this Schmitt trigger circuit are expressed as follows:

$$Vth^+ = ER5(R4+R6)/(R4R5+R5R6+R6R4) \tag{2}$$

$$Vth^- = ER5R6/(R4R5+R5R6+R6R4) \tag{3}$$

Moreover, the potential VAG on the analog ground terminal AG changes, when the power source E is turned on, as follows:

$$VAG = [ER3/(R2+R3)](1 - \epsilon^{-t(R2+R3)/(C2R2R3)}) \tag{4}$$

Figure 3:
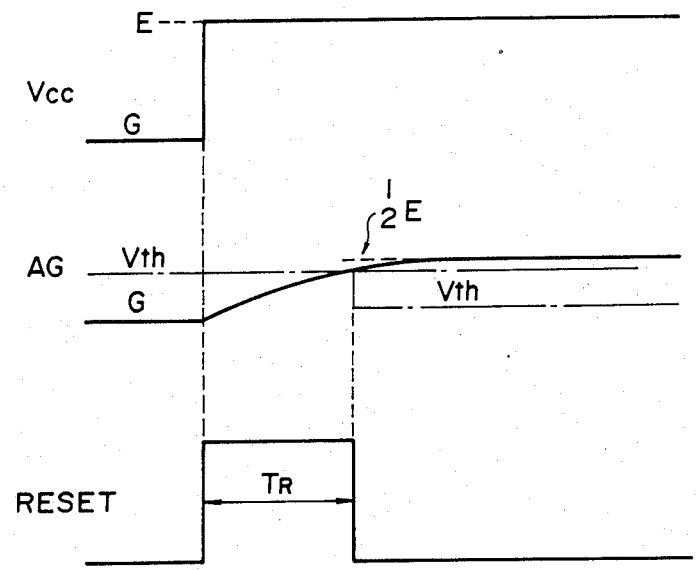
FIG. 3 is a view illustrating a waveform of operation of the circuit shown in FIG. 2.

The respective threshold values $Vth^+$ and $Vth^-$ are set by the resistors R4, R5, and R6 in the expressions (2) and (3) such that the threshold value $Vth^+$ is slightly lower than a stationary value of the analog ground potential VAG and the threshold value $Vth^-$ is slightly higher than the power source ground potential VG as illustrated in FIG. 3.

On the assumption that the expressions (2) and (4) are equal to each other, a time interval TR can be estimated of the analog ground potential VAG changing from the time the power source E is turned on to the time the voltage on the reset terminal RESET, i.e., an output of the operational amplifier OP becomes the L level.

The output of the operational amplifier OP keeps the H level until the above interval TR passes after the power source is turned on, while allowing the internal logical circuit LGC2 to be reset, and after the passage of this time interval TR, the internal logical circuit LGC2 is released to permit the integrated circuit LSI2 to start ordinary operation thereof. Here, the threshold value $Vth^-$ is a potential indicative of the condition for the output of the operational amplifier OP changing from the L to H level. Moreover, a potential difference between the threshold values $Vth^+$ and $Vth^-$ is set as a margin for noise superposed on the analog ground potential VAG when for example the power source E is turned on.

Figure 4:
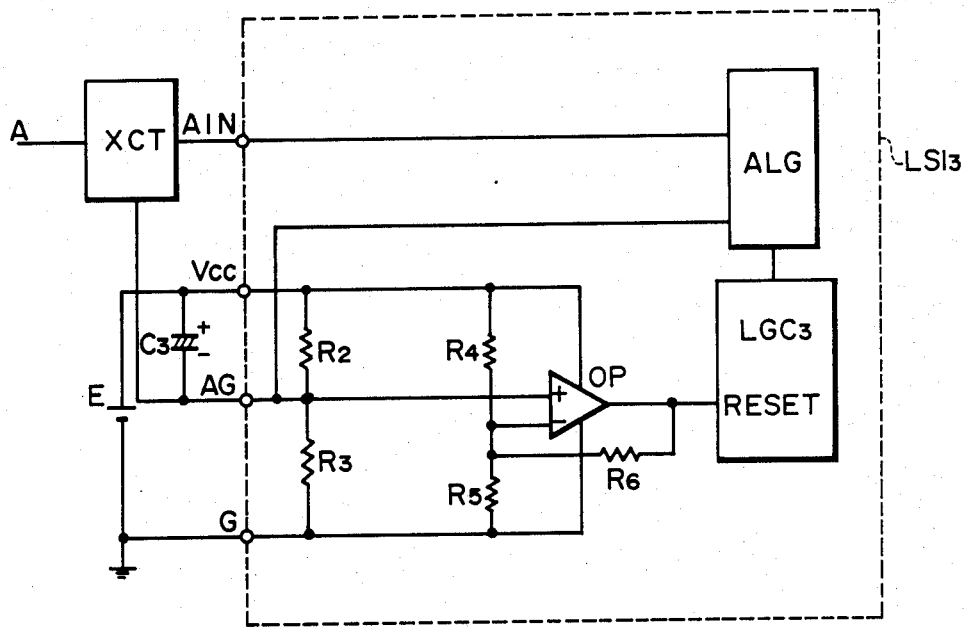
FIG. 4 is a circuit block diagram of another embodiment of an analog-digital hybrid IC according to the present invention.

Referring to FIG. 4, illustrating a circuit block diagram of another embodiment of an analog-digital hybrid integrated circuit according to the present invention, the LSI3 has an analog signal input terminal AIN, a power source terminal VCC, an analog ground terminal AG, and a power source ground terminal G. An internal analog circuit ALG is connected to the analog signal input terminal AIN, the analog ground terminal AG and an internal logical circuit LGC3. A power source E is supplied to the power source terminal VCC and halved by resistors R2 and R3. The analog ground terminal AG is supplied with half of the potential VCC (E/2) for maximizing the dynamic range of an analog signal. In addition, a by-pass capacitor C3 is connected between the analog ground terminal AG and the power source terminal VCC.

An external analog circuit XCT has an output line thereof connected to the analog signal input terminal AIN and an input line A applied an analog signal, and is connected to the analog ground terminal AG. An operational amplifier OP has a plus (+) terminal thereof for receiving the potential on the analog ground terminal AG and a minus (−) terminal thereof for receiving a synthesized potential of divided voltage of the power source terminal VCC by resistors R4 and R5 and a feedback potential from an output of the operational amplifier OP via a resistor R6. The output of the operational amplifier OP keeps the Low level until the predetermined time interval passes away the power source is turned on, while allowing the internal logical circuit LGC3 to be reset, and after the passage of this time interval, the output of the operational amplifier OP changes from Low to High level and the internal logical circuit LGC3 is released to permit the integrated circuit LSI3 to start ordinary operation thereof.

Although certain preferred embodiments have been shown and described, it should be understood that many changes and modifications may be made therein without departing from the scope of the appended claims.

What is claimed is:

1. A circuit for resetting a logical circuit contained within an integrated circuit comprising:
   an analog signal input terminal for receiving an analog signal;
   a power source terminal for supplying a source voltage to said integrated circuit;
   a power source ground terminal for providing a ground potential to said integrated circuit;
   an analog ground terminal connected to said power source terminal and said power source ground terminal by a voltage divider means so as to provide an intermediate potential between a power source potential on said power source terminal and said ground potential on said power source ground terminal;
   a by-pass capacitor connected between said analog ground terminal and said power source ground terminal;
   a level comparing means having a minus (−) terminal and a plus (+) terminal, said minus (−) terminal being connected to said analog ground terminal and said plus (+) terminal being adapted to receive a synthesized potential of voltage of said power source terminal divided by resistive means and a feedback potential from an output of said level comparing means via another resistive means, said level comparing means comparing said potential on said analog ground terminal with first and second threshold voltages, and delivering a high level voltage to said logical circuit so as to reset said logical circuit when said potential on said analog ground terminal is lower than said first threshold voltage while delivering a low level voltage to said logical circuit when said potential on said analog ground terminal is higher than said second threshold voltage; wherein said by-pass capacitor is arranged external to said integrated circuit and wherein said level comparing means and voltage divider means and resistive means and another resistive means are disposed internal to said integrated circuit; whereby said analog signal input terminal serves both as a means for inputting an analog signal to said integrated circuit as well as serving as part of a circuit used to reset said logical circuit contained within said integrated circuit.

2. A circuit according to claim 1, wherein said voltage divider means connected to said analog ground terminal has resistors for halving the potential on said power source terminal so as to thereby maximize the dynamic range of said input analog signal.

3. A circuit according to claim 1, wherein said first and second threshold voltages are respectively expressed by:

$$Vth^- = ER5[R6/(R4R5+R5R6+R6R4)]$$

and $$Vth^+ = ER5(R4+R6)/(R4R5+R5R6+R6R4)$$

where E is said power source potential, R4 and R5 are respectively resistors of said resistive means connected to said level comparing means for dividing the potential on said power source terminal, and R6 is said another feedback resistive means of said level comparing means.

4. A circuit according to claim 3, wherein said threshold voltages are set such that $Vth^+$ is slightly lower than a stationary value of said analog ground potential and Vth$^-$ is slightly higher than said power source ground potential.

5. A circuit according to claim 3, wherein said first threshold value provided a condition for the output of said level comparing means changing from a low level on which said level means stays to a high level.

6. A circuit according to claim 3, wherein a potential difference between said first and second threshold values is set as a noise margin superposed on said analog ground potential.

7. An analog-digital hybrid integrated circuit according to claim 1, wherein said analog ground terminal potential changes as follows:

$$VAG = [ER3/(R2+R3)](1 - \epsilon^{-t(R2+R3)/(C2R2R3)})$$

where E is said power source voltage, t is time, R2 and R3 are respectively resistors of said resistive means for halving said power source terminal potential, and C2 is said by-pass capacitance.

8. A circuit for resetting a logical circuit contained within an integrated circuit comprising:
- an analog signal input terminal for receiving an analog signal;
- a power source terminal for supplying a source voltage to said integrated circuit;
- a power source ground terminal for providing a ground potential to said integrated circuit;
- an analog ground terminal connected to said power source terminal and said power source ground terminal by a voltage divider means so as to provide an intermediate potential between a power source potential on said power source terminal and said ground potential on said power source ground terminal;
- a by-pass capacitor connected between said analog ground terminal and said power source terminal;
- a level comparing means having a minus (−) terminal and a plus (+) terminal, said minus (−) terminal being connected to said analog ground terminal and said plus (+) terminal being adapted to receive a synthesized potential of voltage of said power source terminal divided by resistive means and a feedback potential from an output of said level comparing means via another resistive means, said level comparing means comparing said potential on said analog ground terminal with first and second threshold voltages, and delivering a high level voltage to said logical circuit so as to reset said logical circuit when said potential on said analog ground terminal is higher than said first threshold voltage while delivering a low level voltage to said logical circuit when said potential on said analog ground terminal is lower than said second threshold voltage; wherein said by-pass capacitor is arranged external to said integrated circuit and wherein said level comparing means and voltage divider means and resistive means and another resistive means are disposed internal to said integrated circuit; whereby said analog signal input terminal serves both as a means for inputting an analog signal to said integrated circuit as well as serving as part of a circuit used to reset said logical circuit contained within said integrated circuit.

9. A circuit according to claim 8, wherein said voltage divider means connected to said analog ground terminal has resistors for halving the potential on said power source terminal so as to thereby maximize the dynamic range of said input analog signal.

10. A circuit according to claim 8, wherein said first and second threshold voltages are respectively expressed by:

$$Vth^- = ER5[R6/(R4R5 + R5R6 + R6R4)]$$

and $$Vth^+ = ER5(R4+R6)/(R4R5 + R5R6 + R6R4)$$

where E is said power source potential, R4 and R5 are respectively resistors of said resistive means connected to said level comparing means for dividing the potential on said power source terminal, and R6 is said another feedback resistive means of said level comparing means.

11. A circuit according to claim 10, wherein said threshold voltages are set such that Vth$^+$ is slightly lower than a stationary value of said analog ground potential and Vth$^-$ is slightly higher than said power source ground potential.

12. A circuit according to claim 10, wherein said first threshold value provided a condition for the output of said level comparing means changing from a low level on which said level means stays to a high level.

13. A circuit according to claim 10, wherein a potential difference between said first and second threshold values is set as a noise margin superposed on said analog ground potential.

* * * * *